United States Patent [19]

Oku et al.

[11] Patent Number: 5,358,885
[45] Date of Patent: Oct. 25, 1994

[54] METHOD OF MANUFACTURING A FIELD EFFECT TRANSISTOR WITH A T-SHAPED GATE ELECTRODE AND REDUCED CAPACITANCE

[75] Inventors: Tomoki Oku; Masayuki Sakai; Yasutaka Kohno, all of Itami, Japan

[73] Assignee: Mitsubishi Denki Kabushiki Kaisha, Tokyo, Japan

[21] Appl. No.: 46,811

[22] Filed: Apr. 16, 1993

[30] Foreign Application Priority Data

Aug. 19, 1992 [JP] Japan ................... 4-244217

[51] Int. Cl.⁵ .............................. H01L 21/44
[52] U.S. Cl. ..................... 437/39; 437/203; 437/192; 437/944; 437/912; 148/DIG. 100; 148/DIG. 139
[58] Field of Search ............ 437/228, 912, 203, 187, 437/41, 189, 39, 175, 230; 148/DIG. 100, DIG. 139, DIG. 140; 257/283, 284

[56] References Cited

U.S. PATENT DOCUMENTS

| 4,536,942 | 8/1985 | Chao et al. ................ 29/571 |
| 4,927,789 | 5/1990 | Davey et al. ............... 437/184 |
| 5,032,541 | 7/1991 | Sakamoto et al. ........... 437/203 |
| 5,110,751 | 5/1992 | Nakagawa ................ 437/40 |
| 5,130,764 | 7/1992 | Centronio et al. ........... 357/22 |
| 5,256,597 | 10/1993 | Gambino ................. 437/189 |

FOREIGN PATENT DOCUMENTS

| 63-204772 | 8/1988 | Japan . |
| 63-174374 | 11/1988 | Japan . |
| 1-024465 | 1/1989 | Japan . |
| 1-059940 | 3/1989 | Japan . |
| 2-189936 | 7/1990 | Japan . |
| 3-262124 | 11/1991 | Japan . |
| 4-011741 | 1/1992 | Japan . |
| 4-093030 | 3/1992 | Japan . |

OTHER PUBLICATIONS

Hanyu et al. "Super low–noise HEMTs with a T-shaped WSi$_x$ Gate", Electronics Letters, vol. 24, No. 21, Oct. 13, 1988, p. 1327.

*Primary Examiner*—George Fourson
*Assistant Examiner*—David M. Mason
*Attorney, Agent, or Firm*—Leydig, Voit & Mayer

[57] ABSTRACT

A method of producing a field effect transistor includes depositing a first insulating film and a refractory metal on a semiconductor substrate, forming a first aperture penetrating the first insulating film and the refractory metal film to provide a gate electrode production region, depositing a second insulating film on the refractory metal film, etching the second insulating film in a direction perpendicular to the surface of the substrate leaving portions of the second insulating film on opposite side walls of the first aperture to form a second aperture, defining a gate length, depositing a gate metal, and patterning the gate metal layer, the first insulating film, and the refractory metal film in a prescribed width to form a T-shaped gate structure. During etching the second insulating film, since the refractory metal film serves as a etch stopping layer, the first insulating film is not etched and its thickness remains as deposited. Therefore, the space between the over-hanging portion of the T-shaped gate electrode and the source electrode increases and the gate-to-source capacitance is reduced.

5 Claims, 7 Drawing Sheets

METHOD OF MANUFACTURING A FIELD EFFECT TRANSISTOR WITH A T-SHAPED GATE ELECTRODE AND REDUCED CAPACITANCE

FIELD OF THE INVENTION

The present invention relates to a field effect transistor having a T-shaped gate electrode and a method for producing the field effect transistor.

BACKGROUND OF THE INVENTION

FIGS. 4(a) to 4(k) are cross-sectional views illustrating process steps in a method for fabricating a prior art HEMT (High Electron Mobility Transistor) disclosed in, for example, Japanese Published Patent Application No. 63-174374 and Electronics Letters 24, 1988, p.1327.

Initially, a GaAs buffer layer 21, an intrinsic type (hereinafter referred to as i type) GaAs layer 22, an n type AlGaAs layer 23, and an n+ type GaAs layer 24 are successively grown on a semi-insulating GaAs substrate (not shown) by epitaxial growth. Then, an $SiO_2$ film is deposited on the substrate to a thickness of about 3000 angstroms, forming a first insulating film 25. Then, a resist pattern 27 having an aperture of 0.5 micron width is formed on the first insulating film 25 (FIG. 4(a)).

Then, as illustrated in FIG. 4(b), the first insulating film 25 is etched using the first resist pattern 27 as a mask to form a first aperture 25a. Preferably, the first insulating film 25 is etched by dry etching using a mixture of $CHF_3$ and $O_2$ or $CF_4$ and $O_2$. Then, using the resist pattern 27 and the first insulating film 25 as a mask, the n+ type GaAs layer 24 is etched to form a recess 24a having a depth of about 1000 angstroms. Preferably, the GaAs layer 24 is etched by reactive ion etching using $CCl_2F_2$ or by wet etching using a mixture of tartaric acid and hydrogen peroxide as an etchant (FIG. 4(c)). In FIG. 4(c), although the n+ type GaAs layer 24 is etched to expose the surface of the n type AlGaAs layer 23, the etching may be stopped in the n+ type GaAs layer 24.

After removing the resist pattern 27 using $O_2$ ashing or an organic solvent as shown in FIG. 4(d), an $SiO_2$ film is deposited on the n type AlGaAs layer 23 and the first insulating film 25 to a thickness of about 3000 angstroms, forming a second insulating film 28 (FIG. 4(e)). Preferably, the $SiO_2$ film is deposited by plasma CVD.

Then, as illustrated in FIG. 4(f), the second insulating film 28 is etched in the perpendicular direction to the surface of the substrate by sputter etching or reactive ion etching, leaving portions at opposite sides of the first aperture 25a to form a second aperture 28a. The width $w_1$ of the n type AlGaAs layer 23 exposed at the bottom of the second aperture 28a is about 0.25 micron.

Then, as illustrated in FIG. 4(g), a refractory metal 29, such as WSi, is deposited on the substrate to a thickness of 1500 angstroms by sputtering, followed by annealing. Then, a low resistance metal layer 30 comprising Ti 500 angstroms thick, Pt 1000 angstroms thick, and Au 3000 angstroms thick is formed on the refractory metal layer 29 by sputtering.

Then, a resist pattern 31 is formed on the low resistance metal layer 30. Using the resist pattern 31 as a mask, the low resistance metal layer 30 comprising Ti/Pt/Au is patterned by ion milling, and the refractory metal layer 29 comprising WSi and the insulating film 25 comprising $SiO_2$ are patterned by reactive ion etching (FIG. 4(h)). During the etching process, the refractory metal layer 29 and the insulating film 25 are excessively etched, so that the width of the refractory metal layer 29 is narrower than the width of the low resistance metal layer 30. FIG. 4(i) illustrates a case where the etching rate of the reactive ion etching is further increased. In this case, the width of the refractory metal layer 29 is further decreased and the insulating film 25 is completely removed.

After removing the resist pattern 31 as shown in FIG. 4(j), a resist pattern for forming ohmic electrodes (not shown) is formed on the substrate, followed by a deposition of an ohmic electrode metal 32 comprising AuGe/Ni/Au and lift-off, resulting in a T-shaped gate electrode 33 and ohmic electrodes, i.e., source and drain electrodes 32a and 32b. Thereafter, the substrate is annealed at 400° C. for two minutes to complete the HEMT of FIG. 4(k).

Since the insulating film 25 comprising $SiO_2$ lying under the refractory metal layer 29 is completely removed in the step of FIG. 4(i), the gate-to-source capacitance (Cgs) is reduced. The insulating film 28 remaining on opposite sides of the lower part of the T-shaped gate electrode 33 protects the surface of the n type AlGaAs layer 23.

In the conventional HEMT, a region in which electrons travel, i.e., a region of the i type GaAs layer 22 where a two-dimensional electron gas is formed, is spaced apart from a region that supplies electrons, i.e., the n type AlGaAs layer 23, by the heterojunction to prevent the electrons from being scattered by donor impurities, whereby the electron mobility of the transistor is increased. In the HEMT, in order to increase the cut-off frequency ($f_t$), the maximum oscillation frequency ($f_{max}$), the unilateral gain (U) to reduce the noise factor ($F_0$), it is necessary to reduce the gate length (Lg), the source resistance (Rs), the gate-to-source capacitance (Cgs), and the gate resistance (Rg).

In the conventional method for producing the HEMT illustrated in FIGS. 4(a)-4(k), since the gate electrode and the source and drain electrodes are formed self-alignedly, it is possible to reduce the gate length and the source resistance. In addition, since the gate electrode is formed in a T shape, the gate resistance is reduced to some extent.

In the steps of FIGS. 4(e) and 4(f), the second insulating film 28 is deposited on the substrate to fill the first aperture 25a and then etched away leaving portions on opposite side walls of the aperture 25a, which portions form a second aperture 28a having a width $w_1$ of 0.25 micron that would be a gate length. Thereafter, the refractory metal 29 is deposited in the aperture 28a to form the lower part of the gate electrode. However, during etching the second insulating film 28, the first insulating film 25 is also etched and the thickness thereof is reduced, whereby, in the structure of FIG. 4(k), the interval between the over-hanging part 33a of the T-shaped gate electrode 33 and the surface of the n+ type GaAs layer 24 whereon the source and drain electrodes 32a and 33b are present is reduced, resulting in an increase in the gate-to-source capacitance.

Although it is thought that the above-described problem can be solved by increasing the thickness of the first insulating film 25, if the thickness of the first insulating film 25 increases, the etching precision when the aperture 25a is formed in the first insulating film 25 is reduced, and the aperture 25a is not completely filled with the second insulating film 28 when the insulating film 28 is deposited on the substrate. In this case, it is difficult to form the fine aperture 28a having a width $w_1$ of about 0.25 micron with high controllability.

In the step of FIG. 4(f), the width $w_1$ of the aperture 28a at the n type AlGaAs layer 23 varies according to the thickness of the second insulating film 28 deposited in the step of FIG. 4(e). More specifically, the width $w_1$ decreases with an increase in the thickness of the second insulating film 28. When the second insulating film 28 is deposited to a thickness of 3000 angstroms as described above, the width $w_1$ is about 0.25 micron. If the thickness of the second insulating film 28 is further increased to further reduce the gate length, the width of the V-shaped aperture 28a decreases. When the refractory metal 29 is deposited in the narrow V-shaped aperture 28a, the angle of the V-shaped groove 29a, shown in FIG. 5, formed opposite the V-shaped aperture 28a gradually decreases and the refractory metal 29 is not evenly deposited on the surface of the groove 28a, shown in FIG. 4(f). As a result, a void 30a, shown in FIG. 5, is formed in the low resistance metal layer 30 deposited on the refractory metal layer 29. That cavity increases the gate resistance.

Meanwhile, Japanese Published Patent Application No. 63-204772 proposes an improved method of forming a T-shaped gate structure, in which an upper metal layer of the T-shaped gate electrode is formed by plating using a lower metal layer of the gate electrode as a feeding electrode. In this plating method, however, it is difficult to apply ions to the uneven surface in the plating step, such as the surface with the V-shaped groove 29a, while keeping the ion concentration at the surface constant, so that it is impossible to deposit the upper metal layer free of voids.

SUMMARY OF THE INVENTION

It is an object of the present invention to provide a method of producing a field effect transistor having a T-shaped gate structure with reduced gate-to-source capacitance.

It is another object of the present invention to provide a method of producing a field effect transistor that reduces gate length to reduce gate resistance.

It is still another object of the present invention to provide a method of producing a field effect transistor having a T-shaped gate structure with a gate length of 0.25 micron or less and free of voids in an upper metal layer thereof.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a method of producing a field effect transistor includes depositing a first insulating film and a refractory metal film on a semiconductor substrate, forming a first aperture penetrating the first insulating film and the metal thin film, which aperture provides a gate electrode production region, forming a second insulating film on the refractory metal film, etching the second insulating film in a direction perpendicular to the surface of the substrate leaving portions on opposite side walls of the first aperture to form a second aperture, which second aperture provides a gate length, depositing a gate metal layer on the whole surface of the substrate, and patterning the gate metal layer, the first insulating film, and the refractory metal film in a prescribed width to form a T-shaped gate structure. During etching of the second insulating film, since the refractory metal film serves as an etch stopping layer, the first insulating film is not etched and its thickness remains as it is deposited, whereby the space between the over-hanging portion of the T-shaped gate electrode and the source (drain) electrode is increased.

According to a second aspect of the present invention, after producing the T-shaped gate electrode, the first and second insulating films are completely removed and a third insulating film thinner than 500 angstroms is deposited on the whole surface of the T-shaped gate electrode and the substrate. Therefore, the insulating film under the over-hanging portion of the T-shaped gate electrode is reduced. In addition, the third insulating film protects the active region of the device.

According to a third aspect of the present invention, after forming the second insulating film pattern with the second aperture that provides a gate length, a first metal layer is deposited on the substrate to fill the second aperture, and a second metal is applied onto the first metal layer by pulse plating or electroless plating using the first metal layer as a feeding electrode. Therefore, even if the surface of the first metal layer is uneven, the second metal layer is favorably grown on the first metal layer free of voids in the second metal layer.

DETAILED DESCRIPTION OF THE PREFERRED EMBODIMENTS

Figure 1:
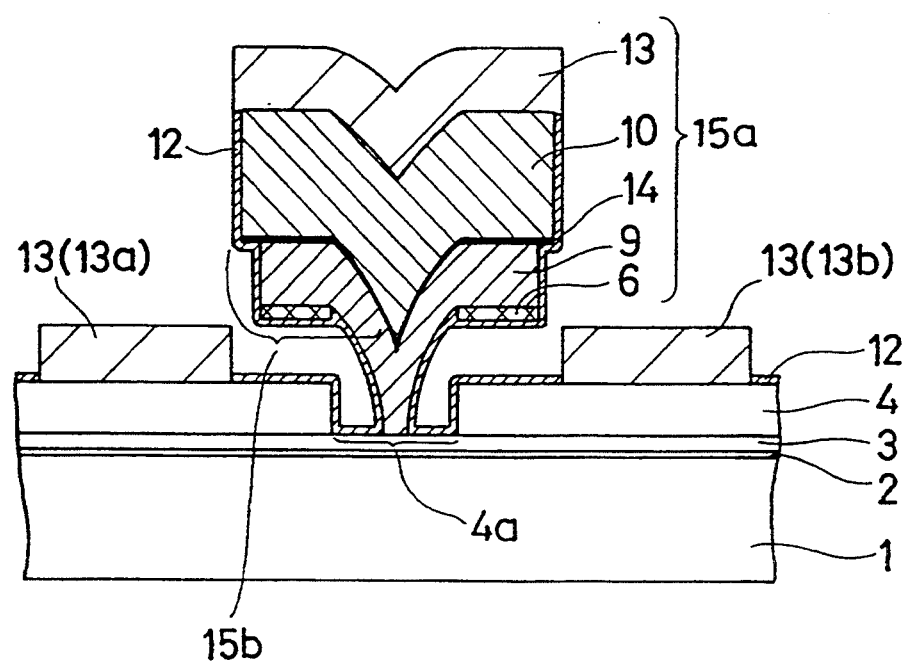
FIG. 1 is a cross-sectional view illustrating a HEMT in accordance with a first embodiment of the present invention.

FIG. 1 is a cross-sectional view illustrating a HEMT in accordance with a first embodiment of the present invention. FIGS. 2(a) to 2(l) are cross-sectional views illustrating process steps in a method of producing the HEMT of FIG. 1.

In FIG. 1, reference numeral 1 designates a GaAs buffer layer. An i type GaAs layer 2 is disposed on the buffer layer 1. An n type AlGaAs layer 3 is disposed on the GaAs layer 2. An n+ type GaAs layer 4 is disposed on the AlGaAs layer 3. A recess 4a penetrates through a portion of the GaAs layer 4. A T-shaped gate electrode 15a is disposed on the n type AlGaAs layer 3 exposed at the bottom of the recess 4a. The T-shaped gate electrode 15a comprises a refractory metal layer 9, a low resistance metal layer 10, and a metal layer 13 for ohmic electrodes. The ohmic electrodes, i.e., source and drain electrodes 13a and 13b, are disposed on the GaAs layer 4 spaced apart from each other. The whole surface of this HEMT is covered with an insulating film 12 except for the metal layer 13. Reference numeral 14 designates a feeding metal layer.

A description is given of the production method.

Figure 2:
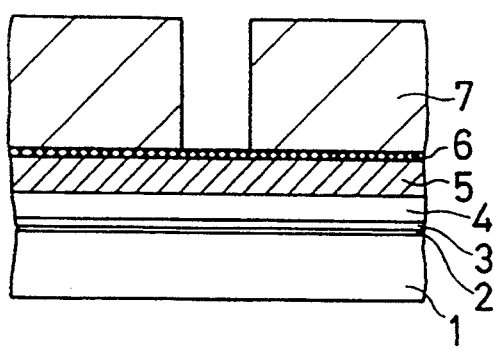
FIGS. 2(a) to 2(l) are cross-sectional views illustrating process steps in a method of producing the HEMT of FIG. 1.
Figure 2:
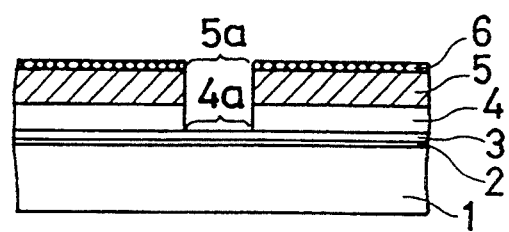
Figure 2:
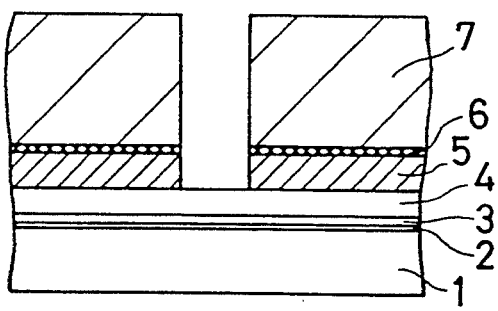
Figure 2:
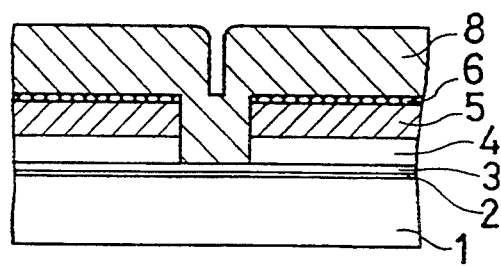
Figure 2:
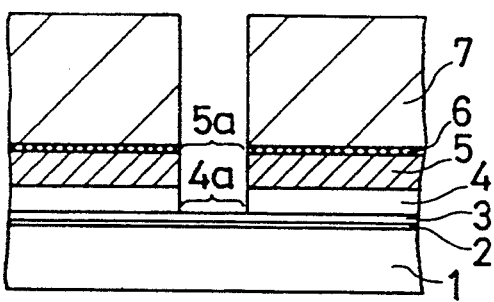
Figure 2:
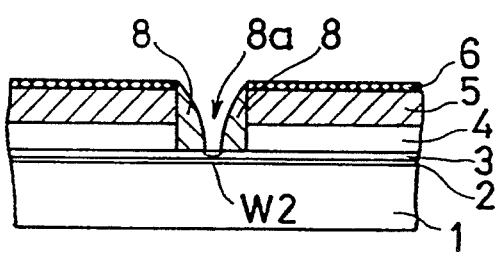

Initially, as illustrated in FIG. 2(a), there are successively grown on a semi-insulating GaAs substrate (not shown) by epitaxial growth, the GaAs buffer layer 1, the i type GaAs layer 2, the n type AlGaAs layer 3, and the n+ type GaAs layer 4. Then, $SiO_2$ is deposited on the substrate to a thickness of about 3000 angstroms by plasma CVD to form a first insulating film 5. Then, WSi is deposited on the first insulating film 5 to a thickness of about 500 angstroms by sputtering to form a refractory metal thin film 6, and a resist pattern 7 having an aperture 0.5 micron wide is formed on the refractory metal thin film 6.

Then, as illustrated in FIG. 2(b), using the resist pattern 7 as a mask, the refractory metal thin film 6 is etched by dry etching using $SF_6$ and the insulating film 5 is etched by dry etching using $CHF_3$, $CF_4$, or the like, forming a first aperture 5a. Thereafter, using the resist pattern 7 and the first insulating film 5 as a mask, the n+ GaAs layer 4 is etched by reactive ion etching using $CCl_2F_2$, $Cl_2$, or $SiCl_4$, or wet etching using a mixture of tartaric acid and hydrogen peroxide, forming a recess 4a having a depth of about 1000 angstroms (FIG. 2(c)). In FIG. 2(c), although the n+ type GaAs layer 4 is etched to expose the surface of the n type AlGaAs layer 3, the etching may be stopped within the n+ type GaAs layer 4.

After removing the resist pattern 7 using $O_2$ ashing or an organic solvent as shown in FIG. 2(d), $SiO_2$ is deposited over the surface of the substrate to a thickness of 3000 to 5000 angstroms by plasma CVD, forming a second insulating film 8.

Then, as illustrated in FIG. 2(f), the second insulating film 8 is etched in the vertical direction to expose the surface of the substrate by sputter etching or reactive ion etching, leaving portions of the insulating film 8 on the opposite side walls of the first aperture 5a. During the etching, since the refractory WSi thin film 6 serves as an etching stopper layer, the thickness of the first insulating film 5 lying under the WSi thin film 6 is not reduced. For example, while the etching rate of a mixture of $CHF_3$ and $O_2$ to $SiO_2$ is about 500 angstroms/min, the etching rate of WSi by the mixture is only about 100 angstroms/min. In this case, the time interval required for etching the second insulating film 8 comprising $SiO_2$ 5000 angstroms thick is 10 min, and the time interval required for etching the WSi thin film 6 500 angstroms thick is 5 min and, therefore, the first insulating film 5 is not etched even if the second insulating film 8 is excessively etched by 50 percent.

In the step of FIG. 2(f), the width $w_2$ of the second aperture 8a, which is equivalent to a gate length, varies according to the thickness of the second insulating film 8 deposited in the step of FIG. 2(e). For example, when the thickness of the second insulating film 8 increases from 3000 angstroms to 5000 angstroms, the width $w_2$ decreases from 0.25 micron to 0.15 micron.

Figure 2G:
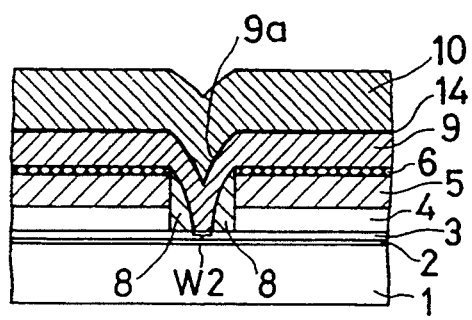

Then, as illustrated in FIG. 2(g), a refractory metal, such as WSi, is deposited on the whole surface of the substrate to a thickness of about 1500 angstroms by sputtering, resulting in a refractory metal layer 9. Thereafter, the substrate is annealed at 400° to 500° C. to remove damage on the surface of the aperture 8a due to the sputtering. Then, Au or the like is deposited on the refractory metal layer 9 to a thickness of about 500 angstroms, forming a feeding metal layer 14 which serves as a feeding electrode when a metal layer is plated thereon. Then, Au or the like is applied onto the feeding metal layer 14 to a thickness of about 4000 angstroms by pulse plating or electroless plating, forming a low resistance metal layer 10.

The pulse plating and the electroless plating employed for depositing the low resistance metal layer 10 have the following advantages. When the width $w_2$ of the aperture 8a is narrower than 0.2 micron, the width of the V-shaped groove 9a formed on the surface of the refractory metal layer 9 during depositing the metal layer 9 by sputtering is very narrow. However, since the feeding metal layer 14 is present on the surface of the V-shaped groove 9a, when the low resistance metal layer 10 comprising Au is depositing on the feeding metal layer 14, Au ions are evenly applied to the surface of the feeding metal layer 14 in the V-shaped groove 9, so that there are no voids in the low resistance metal layer 10.

Figure 2J:
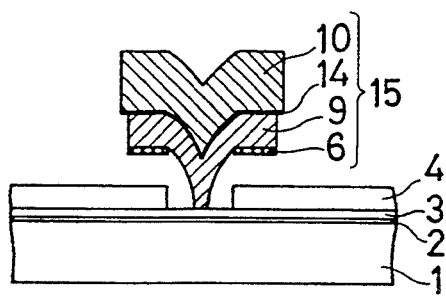
Figure 2H:
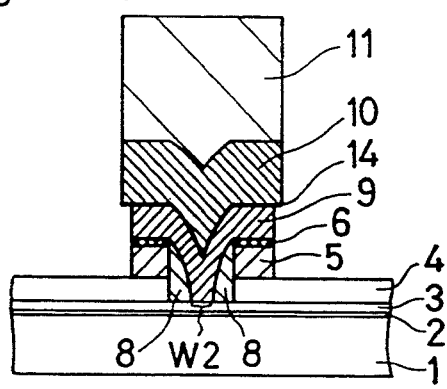

Then, as illustrated in FIG. 2(h), a resist pattern 11 having a prescribed width is formed on the low resistance metal layer 10. Then, using the resist pattern 11 as a mask, the low resistance metal layer 10 and the feeding metal layer 14 are etched by ion milling, and the WSi refractory metal layer 9, the WSi refractory metal thin film 6, and the first insulating film 5 are etched by reactive ion etching. During the etching, the refractory metal layers 9 and 6 and the insulating film 5 are excessively etched.

Figure 2K:
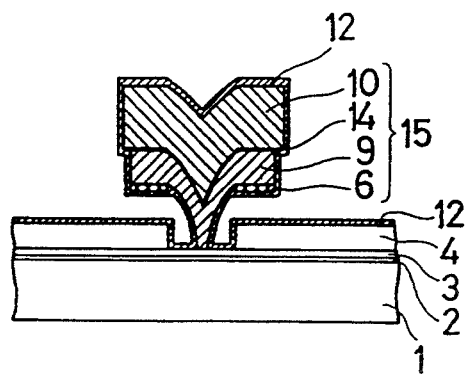
Figure 2I:
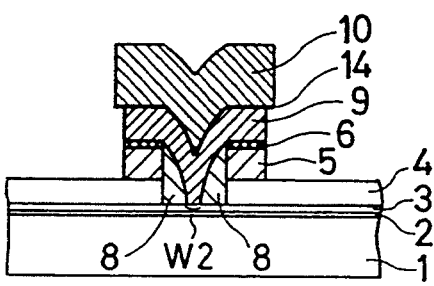
Figure 2L:
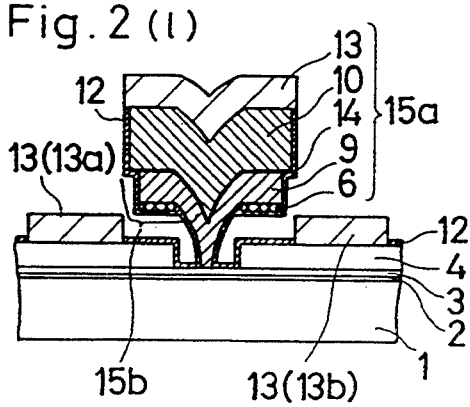

After removing the resist pattern 11 as shown in FIG. 2(i), the substrate is soaked in a solution comprising HF and $NH_4F$ ($HF:NH_4F=1:6$) for a few minutes to completely remove the first and second insulating films 5 and 8 as shown in FIG. 2(j), resulting in a T-shaped gate structure 15.

Then, as illustrated in FIG. 2(k), $SiO_2$ is deposited on the whole surface of the structure to a thickness of 500 angstroms or less by plasma CVD, forming a third insulating film 12. Then, using a resist pattern (not shown) as a mask, portions of the third insulating film 12 on the top of the T-shaped gate structure 15 and on regions of the n+ type GaAs layer 4 where source and drain electrodes are to be disposed are removed by reactive ion etching, followed by a deposition of an ohmic electrode metal 13 and lift-off, resulting in a T-shaped gate electrode 15a and ohmic electrodes, i.e., source and drain electrodes 13a and (FIG. 2(l)). Finally, the substrate is annealed at 400° C. for a few minutes to complete the HEMT of FIG. 1.

When the third insulating film 12 is formed in the step of FIG. 2(k), since the material, i.e., $SiO_2$, is not efficiently applied to the over-hanging portions 15b of the T-shaped gate structure 15, the thickness of the insulating film 12 on the over-hanging portions is very thin.

While in the step of FIG. 2(g) the Au layer 14 is formed on the refractory metal layer 9, a Ti film may be formed in place of the refractory metal layer 9 and then the Au layer 14 deposited to a thickness of 2000 angstroms.

Figure 4:
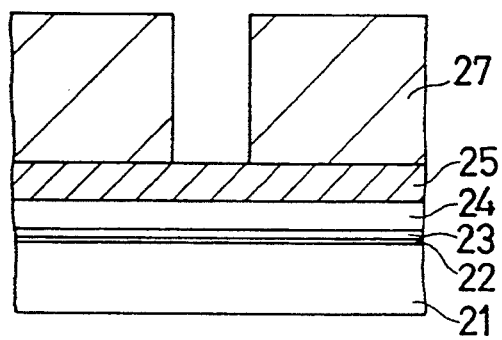
FIGS. 4(a) to 4(k) are cross-sectional views illustrating process steps in a method of producing a HEMT according to the prior art.
Figure 4:
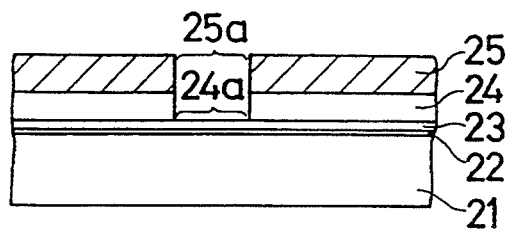
Figure 4:
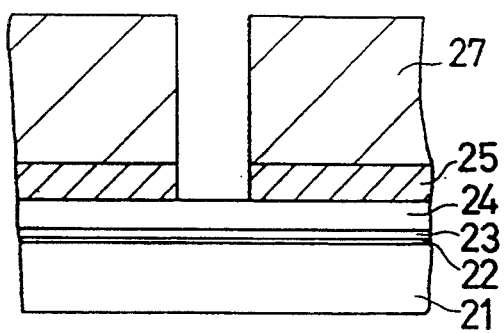
Figure 4:
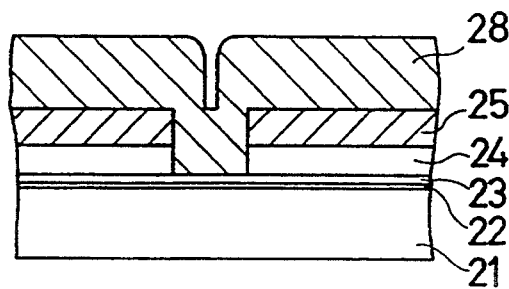
Figure 4:
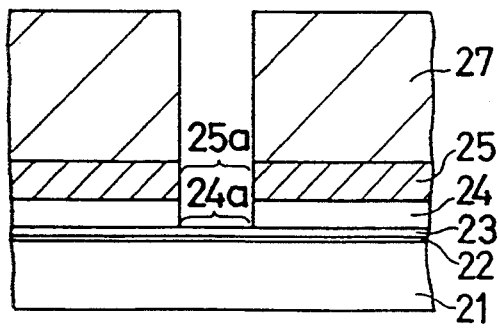
Figure 4:
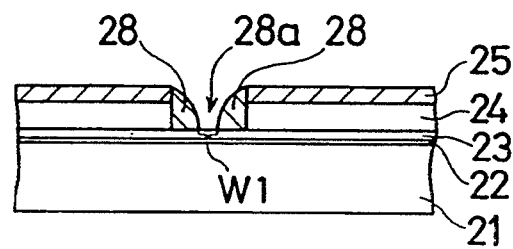
Figure 4G:
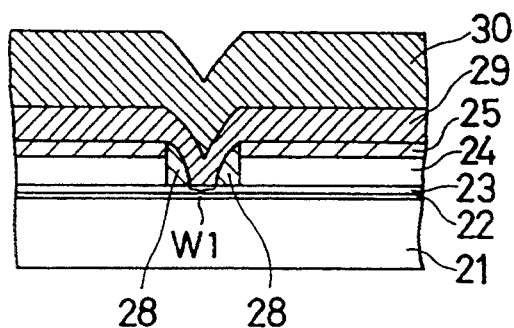
Figure 4J:
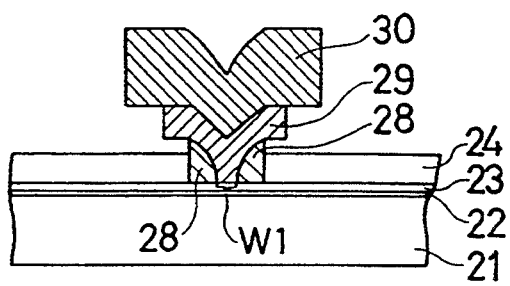
Figure 4H:
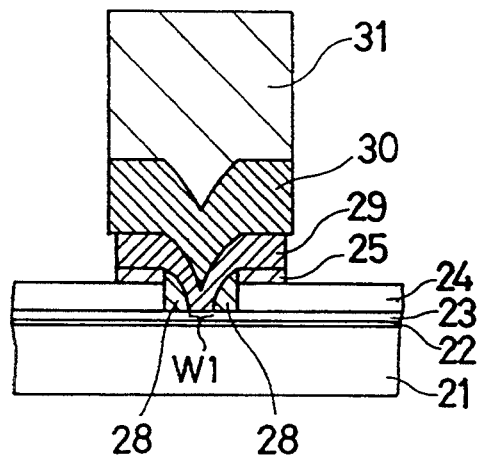

A description is given of a comparison between the gate-to-source capacitance of the HEMT of FIG. 1 fabricated by the process steps of FIGS. 2(a)-2(l) according to the first embodiment and the gate-to-source capacitance of the prior art HEMT fabricated by the process steps of FIGS. 4(a)-4(K). These two HEMTs have the same length of the over-hanging portion of the T-shaped gate structure and the same gate width. The thickness of the first insulating film 5 deposited in the step of FIG. 2(a) is 2000 angstroms, and the thickness of the first insulating film 25 etched in the step of FIG. 4(f) is 1000 angstroms. Therefore, the separation between the over-hanging portion 15b of the T-shaped gate structure 15a and the n+ type GaAs layer 4 of the HEMT of FIG. 1 is 1000 angstroms larger than that of the prior art HEMT because of the increase in the thickness of the insulating film 5, whereby the capacitance beneath the over-hanging portion 15b is reduced to half of that of the prior art HEMT, resulting in a reduction in the gate-to-source capacitance.

Figure 4K:
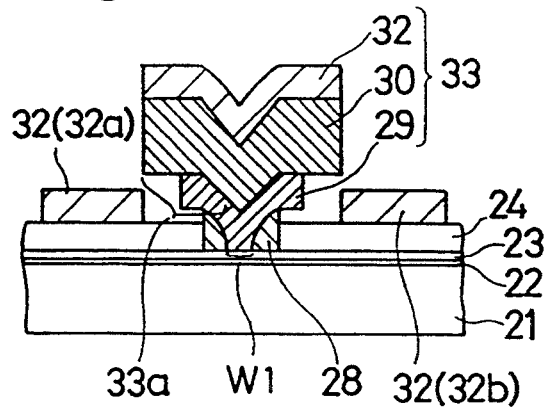
Figure 4I:
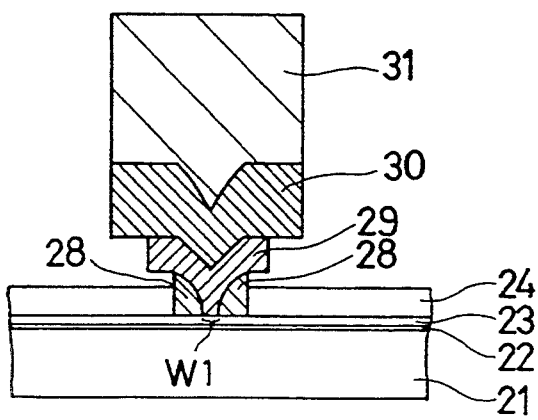
Figure 5:
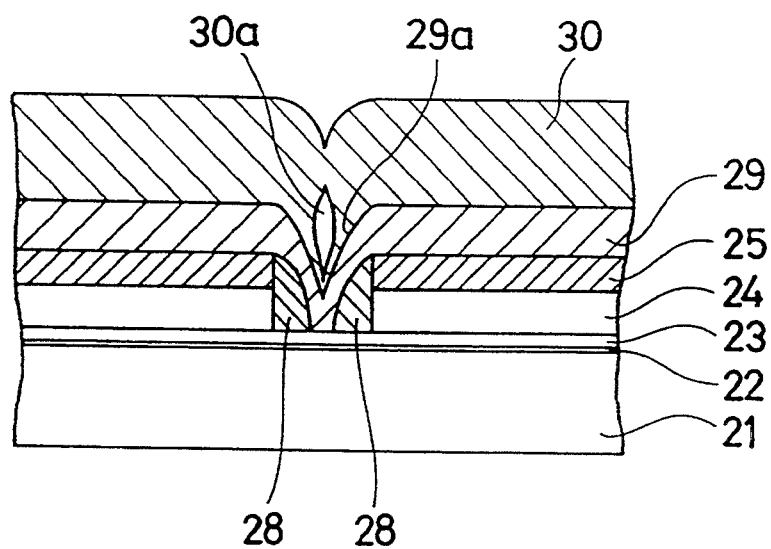
FIG. 5 is a cross-sectional view for explaining a problem in the method according to the prior art.

In the prior art HEMT of FIG. 4(k), portions of the second insulating film 28 remain on opposite sides of the lower part of the T-shaped gate structure 33. In the HEMT of FIG. 1, however, only the insulating film 12, which is as thin as or thinner than 500 angstroms, is present under the T-shaped gate structure 15a, so that the dielectric constant between the over-hanging portion 15b and the n+ type GaAs layer 4 is reduced as compared with that of the prior art HEMT, resulting in a further reduction in the gate-to-source capacitance Cgs.

As described above, according to the first embodiment of the present invention, a high-performance HEMT with short gate length, reduced gate-to-source capacitance, and reduced gate resistance is achieved.

Figure 3:
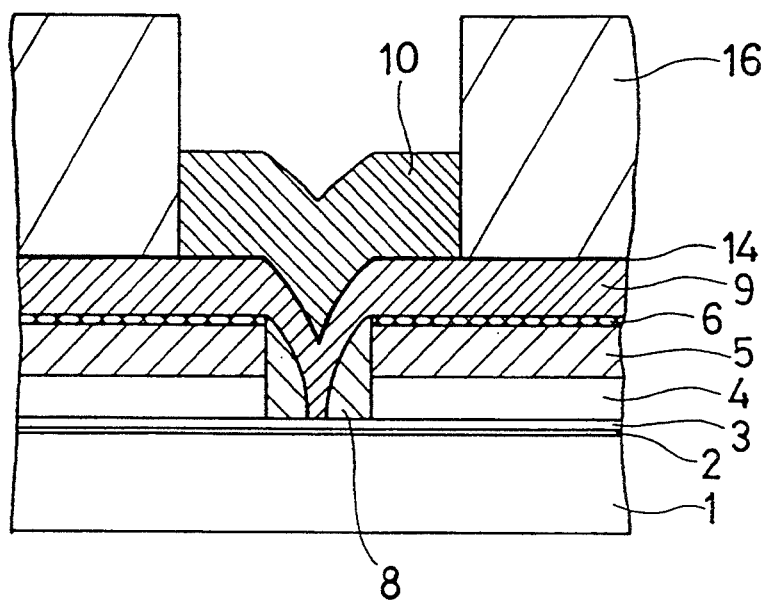
FIGS. 3(a) and 3(b) are cross-sectional views illustrating process steps in a method of producing a HEMT in accordance with a second embodiment of the present invention.
Figure 3:
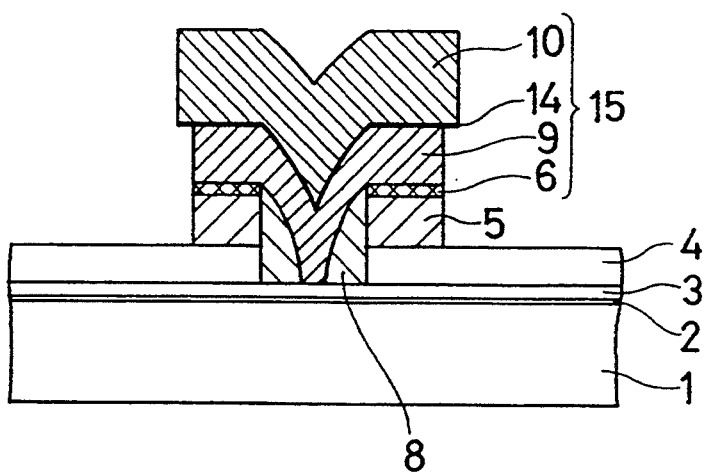

FIGS. 3(a) and 3(b) are cross-sectional views illustrating process steps in a method of producing a HEMT according to a second embodiment of the present invention. In the figures, the same reference numerals as in FIGS. 2(a)-2(l) designate the same parts.

After producing the semiconductor epitaxial layers 1 to 4, the first insulating film 5, the second insulating film 8, the refractory metal layers 6 and 9, and the feeding metal layer 14 in the same manner as described with respect to FIGS. 2(a) to 2(g), a resist pattern 16 having an aperture of prescribed width is formed on the feeding metal layer 14 and then the low resistance metal layer 10 is deposited on the feeding metal layer 14 by pulse plating or electroless plating (FIG. 3(a)). After removing the resist pattern 16, using the low resistance metal layer 10 as a mask, the feeding metal layer 14, the refractory metal layers 6 and 9, and the first insulating film 5 are patterned to form the T-shaped gate structure 15. Then, the first and second insulating films 5 and 8 are removed in the same manner as described in the first embodiment, followed by the deposition of the third insulating film 12 and the formation of the source and drain electrodes 13a and 13b. Also in this second embodiment, a high-performance HEMT with a short gate length, reduced gate-to-source capacitance, and reduced gate resistance is achieved.

While in the above-described first and second embodiments the GaAs heterojunction epitaxial substrate comprising the GaAs buffer, the i type GaAs, the n type AlGaAs, and the n+ GaAs is employed, a GaAs heterojunction epitaxial substrate for a pseudomorphic HEMT including i type InGaAs between the i type GaAs and the n type AlGaAs may be employed. Alternatively, the substrate may comprise other semiconductor materials, such as InP.

While in the above-described embodiments HEMTs are employed, the present invention may be applied to other field effect transistors.

What is claimed is:

1. A method of producing a field effect transistor comprising:

successively depositing a first insulating film and a metal film on a semiconductor epitaxial layer disposed on a semiconductor substrate;

forming and patterning a first resist film to have an aperture on said metal film;

etching said metal film and said first insulating film using said first resist film as a mask to form a first aperture having side walls;

removing said first resist film and depositing a second insulating film on said metal film and in the first aperture;

etching said second insulating film in a direction perpendicular to said first insulating film, leaving portions of said second insulating film on the side walls of the first aperture to produce a second aperture within the first aperture;

depositing a gate electrode metal layer on said metal film and in the second aperture on the portions of said second insulating film;

patterning said gate electrode metal layer, said metal film, and said first insulating film to form a T-shaped gate structure;

completely removing said first and second insulating films;

depositing a third insulating film atop said semiconductor epitaxial layer and on said T-shaped gate structure;

forming and patterning a second resist film on said third insulating film, said second resist film being patterned with apertures at regions where source and drain electrodes are to be formed;

removing portions of said third insulating film using said second resist film as patterned as a mask; and depositing an ohmic electrode metal on said second resist film and in the apertures in said second resist film on said semiconductor epitaxial layer and removing said second resist film with the overlying portions of said ohmic electrode metal by lift-off, thereby producing source and drain electrodes.

2. The method of claim 1 including producing said gate electrode metal layer by depositing a first gate electrode metal film and then forming a second gate electrode metal film on said first gate electrode metal film by one of pulse plating and electroless plating using said first gate electrode metal film as a feeding electrode.

3. The method of claim 1 including etching at least part of said semiconductor epitaxial layer in forming the first aperture.

4. A method of producing a field effect transistor comprising:

successively depositing a first insulating film and a metal film on a semiconductor epitaxial layer disposed on a semiconductor substrate;

forming and patterning a first resist film to have an aperture on said metal film;

etching said metal film and said first insulating film using said first resist film as a mask to form a first aperture having side walls;

removing said first resist film and depositing a second insulating film on said metal film to fill the first aperture;

etching said second insulating film in a direction perpendicular to said first insulating film, leaving portions of said second insulating film on the side walls of the first aperture to produce a second aperture within the first aperture;

depositing a first gate metal layer on said metal film and in the second aperture on the portions of said second insulating film;

forming and patterning a second resist film to have an aperture on said first gate metal layer;

forming a second gate metal layer on said first gate metal layer by one of pulse plating and electroless plating;

removing said second resist film and patterning said first insulating film, said metal film, and said first gate metal layer using said second gate metal layer as a mask to produce a T-shaped gate structure;

completely removing said first and second insulating films;

depositing a third insulating film atop said semiconductor epitaxial layer and on said T-shaped gate structure;

forming and patterning a third resist film on said third insulating film, said third resist film being patterned with apertures at regions where source and drain electrodes are to be formed;

removing portions of said third insulating film using said third resist film as patterned as a mask; and depositing an ohmic electrode metal on said third resist film and in the apertures in said third resist film on said semiconductor epitaxial layer and removing said third resist film with the overlying portions of said ohmic electrode metal by lift-off, thereby producing source and drain electrodes.

5. The method of claim 4 including etching at least part of said semiconductor epitaxial layer in forming the first aperture.

* * * * *